US012812870B2

(12) United States Patent
Im

(10) Patent No.: US 12,812,870 B2
(45) Date of Patent: Nov. 24, 2026

(54) SEMICONDUCTOR DEVICE AND METHOD FOR FABRICATING THE SAME

(71) Applicant: SK hynix Inc., Icheon-si (KR)

(72) Inventor: Mir Im, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 863 days.

(21) Appl. No.: 18/060,347

(22) Filed: Nov. 30, 2022

(65) Prior Publication Data

US 2023/0413573 A1 Dec. 21, 2023

(30) Foreign Application Priority Data

Jun. 21, 2022 (KR) ........................ 10-2022-0075756

(51) Int. Cl.

*H10B 51/30* (2023.01)
*H10B 51/20* (2023.01)
*H10B 51/40* (2023.01)

(52) U.S. Cl.

CPC ............. *H10B 51/30* (2023.02); *H10B 51/20* (2023.02); *H10B 51/40* (2023.02)

(58) Field of Classification Search

CPC ......... H10B 51/30; H10B 51/20; H10B 51/40
See application file for complete search history.

(56) References Cited

U.S. PATENT DOCUMENTS 11,430,861 B2 * 8/2022 Thareja .................. H10D 1/684
2018/0059958 A1 3/2018 Ryan et al.
2019/0212919 A1 * 7/2019 Ryan ..................... G06F 3/0611
2019/0326357 A1 10/2019 Castro et al.
2021/0013210 A1 * 1/2021 Lee ........................ H10B 12/50
2021/0036020 A1 2/2021 Park et al.
2021/0159229 A1 5/2021 Gomes et al.
2022/0139916 A1 5/2022 Kwak
2022/0189546 A1 * 6/2022 Gong .................... G11C 11/223
2023/0251828 A1 * 8/2023 Mathuriya .............. G06F 7/508 708/710

FOREIGN PATENT DOCUMENTS

CN 114068424 A 2/2022
CN 114245938 A 3/2022

OTHER PUBLICATIONS

"SoC compatible 1T1C FeRAM memory array based on ferroelectric Hf0.5Zr0.502" Jun Okuno et al. Sony Semiconductor Solutions Corporation, Atsugi, Kanagawa, 243-0014, Japan NaMLab gGmbH, Noethnitzer Str. 64a, Dresden, 01187, Germany Ihm, Tu Dresden, Dresden, 01062, Germany, Fraunhofer IPMS—Center Nanoelectronics Technologies Königsbrücker Str. 178, Dresden, 01099, Germany Contact e-mail: Jun.Okuno@sony.com.

* cited by examiner

*Primary Examiner* — Richard A Booth

(57) ABSTRACT

A semiconductor device includes: a first memory including first capacitors that are vertically stacked in a first direction; and a second memory that is laterally spaced apart from the first memory in a second direction and that includes second capacitors that are vertically stacked in the first direction. The first capacitors may include ferroelectric capacitors, and the second capacitors may include paraelectric capacitors.

15 Claims, 12 Drawing Sheets

SEMICONDUCTOR DEVICE AND METHOD FOR FABRICATING THE SAME

CROSS-REFERENCE TO RELATED APPLICATIONS

The present application claims priority under 35 U.S.C. § 119 to Korean Patent Application No. 10-2022-0075756, filed on Jun. 21, 2022 in the Korean Intellectual Property Office, which is incorporated herein by reference in its entirety.

BACKGROUND

1. Field

Exemplary embodiments of the present invention relate to a semiconductor device, and more particularly, to a semiconductor device with a three-dimensional structure and a method for fabricating the same.

2. Description of the Related Art

Recently, in order to meet demands for increases in capacity and miniaturization of memory devices, a technique for providing a three-dimensional (3D) semiconductor device, in which a plurality of memory cells are stacked, has been proposed.

SUMMARY

Embodiments of the present invention are directed to a highly integrated semiconductor device and a method for fabricating the semiconductor device.

In accordance with an embodiment of the present invention, a semiconductor device includes: a first memory including first capacitors that are vertically stacked in a first direction; and a second memory that is laterally spaced apart from the first memory in a second direction and that includes second capacitors that are vertically stacked in the first direction. The first capacitors may include ferroelectric capacitors, and the second capacitors may include paraelectric capacitors.

In accordance with another embodiment of the present invention, a semiconductor device includes: a first memory including ferroelectric capacitors that are vertically stacked in a first direction; and a second memory laterally spaced apart from the first memory and including paraelectric capacitors that are vertically stacked in the first direction, wherein each of the ferroelectric capacitors includes a first storage node having a vertical flat plate shape, and each of the paraelectric capacitors includes a cylindrical-shaped second storage node.

DETAILED DESCRIPTION

Figure 1:
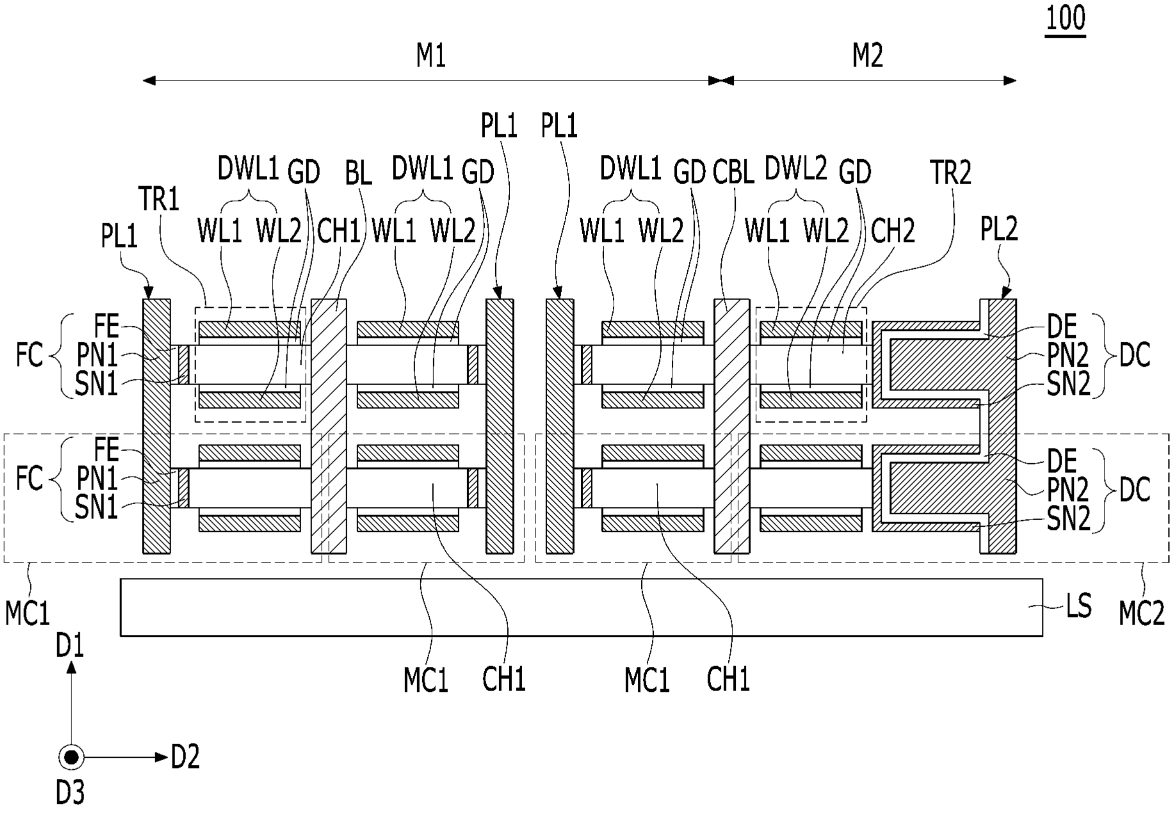
FIG. 1 is a cross-sectional view schematically illustrating a semiconductor device in accordance with an embodiment of the present disclosure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case in which a third layer is included between the first layer and the second layer or the substrate.

According to embodiments of the disclosure described below, memory cell density may be increased and parasitic capacitance may be reduced by vertically stacking memory cells.

Figure 2:
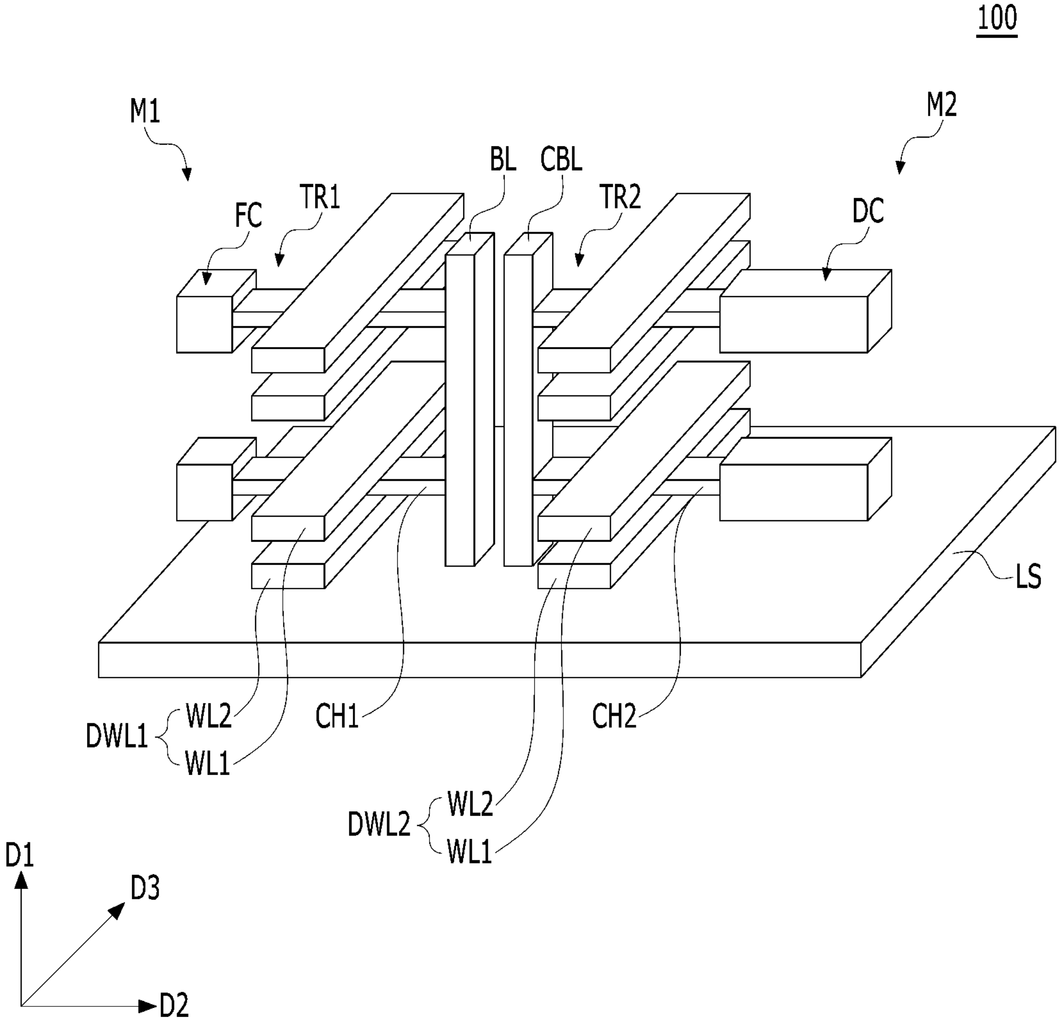
FIG. 2 is a schematic perspective view illustrating the semiconductor device shown in FIG. 1.

FIG. 1 is a cross-sectional view schematically illustrating a semiconductor device in accordance with an embodiment of the present disclosure. FIG. 2 is a schematic perspective view illustrating the semiconductor device shown in FIG. 1.

Referring to FIGS. 1 and 2, a semiconductor device 100 may include a first memory M1 and a second memory M2 over the lower structure LS. The first memory M1 and the second memory M2 may include a non-volatile memory and a volatile memory. For example, the first memory M1 may be a ferroelectric memory FERAM, and the second memory M2 may be a Dynamic Random Access Memory (DRAM). Each of the first memory M1 and the second memory M2 may have a three-dimensional structure. For example, in the first memory M1, a plurality of first memory cells MC1 may be vertically stacked in a first direction D1. In the second memory M2, a plurality of second memory cells MC2 may be vertically stacked in the first direction D1. The first memory M1 and the second memory M2 may be arranged laterally in a second direction D2.

The individual first memory cell MC1 may include a first bit line BL, a first transistor TR1, and a first capacitor FC. The individual second memory cell MC2 may include a second bit line CBL, a second transistor TR2, and a second capacitor DC.

The first capacitor FC of the individual first memory cell MC1 may include a first storage node SN1, a ferroelectric layer FE, and a first plate node PN1. The first plate nodes PN1 of the first capacitors FC may be coupled to the first plate line PL1. The first plate line PL1 and the first plate nodes PN1 may be integrally formed. The first capacitors FC may be vertically stacked in the first direction D1, and the first capacitors FC may share the first plate line PL1. The first capacitors FC may include ferroelectric capacitors.

The second capacitor DC of the individual second memory cell MC2 may include a second storage node SN2, a paraelectric layer DE, and a second plate node PN2. The second plate nodes PN2 of the second capacitors DC may be coupled to the second plate line PL2. The second plate line PL2 and the second plate nodes PN2 may be integrally formed. The second capacitors DC may be vertically stacked in the first direction D1, and the second capacitors DC may share the second plate line PL2. The second capacitors DC may include paraelectric capacitors.

The ferroelectric layers FE of the first capacitors FC may include a ferroelectric material, and the paraelectric layers DE of the second capacitors DC may include a high-k material. The first storage nodes SN1 of the first capacitors FC may have a flat plate shape, and the second storage nodes SN2 of the second capacitors DC may have a cylindrical shape. The first storage nodes SN1 of the flat plate shape may extend vertically in the first direction D1. The second storage nodes SN2 may have a cylindrical shape with a long axis that extends laterally in the second direction D2.

The first transistor TR1 of the individual first memory cell MC1 and the second transistor TR2 of the individual second memory cell MC2 may have substantially the same structure. For example, the individual first transistor TR1 may include a first channel layer CH1, a gate dielectric layer GD, and a first word line DWL1. The individual second transistor TR2 may include a second channel layer CH2, a gate dielectric layer GD, and a second word line DWL2.

The first memory M1 may be a first column array including first capacitors FC that are stacked in the first direction D1. The first capacitors FC of the first column array may be referred to as a first capacitor array. The second memory M2 may be a second column array including second capacitors DC that are stacked in the first direction D1. The second capacitors DC of the second column array may be referred to as a second capacitor array. The first memory M1 and the second memory M2 may be arranged laterally in the second direction D2 to form a row array. In the row array, the first capacitors FC and the second capacitors DC may be isolated from each other. The first storage nodes SN1 of the first capacitors FC of the row array may be isolated from each other, and the first plate nodes PN1 of the first capacitors FC of the row array may be isolated from each other. The second storage nodes SN2 of the second capacitors DC of the row array may be isolated from each other, and the second plate nodes PN2 of the second capacitors DC of the row array may be isolated from each other. The first plate line PL1 and the second plate line PL2 of the row array may be isolated from each other.

The individual first capacitors FC of the first memory M1 may be coupled to the individual first channel layer CH1, and the individual second capacitors DC of the second memory M2 may be coupled to the individual second channel layer CH2. The first capacitors FC may be respectively coupled to the first channel layers CH1, and the second capacitors DC may be respectively coupled to the second channel layers CH2.

The first memory M1 may include first word lines DWL1 that extend in a direction that intersects with the direction in which first channel layers CH1 extend. The second memory M2 may include second word lines DWL2 that extend in a direction that intersects with the direction in which second channel layers CH2 extend.

Each of the first word lines DWL1 and the second word lines DWL2 may include a double word line structure. For example, each of the first and second word lines DWL1 and DWL2 may include a first lateral word line WL1 and a second lateral word line WL2, and the first lateral word line WL1 and the second lateral word line WL2 may face each other with the first and second channel layers CH1 or CH2 interposed therebetween. The first lateral word line WL1 and the second lateral word line WL2 may extend in the third direction D3.

The gate dielectric layers GD may be positioned between the first and second channel layers CH1 and CH2 and the first and second word lines DWL1 and DWL2. The gate dielectric layers GD may include a double gate dielectric layer structure. For example, gate dielectric layers GD may be formed between the first lateral word line WL1 and the first and second channel layers CH1 and CH2, and gate dielectric layers GD may be formed between the second lateral word line WL2 and the first and second channel layers CH1 and CH2.

The first and second bit lines BL and CBL may have a pillar shape extending in the first direction D1. The first and second channel layers CH1 and CH2 may have a bar shape extending in the second direction D2 that intersects with the first direction D1. The first and second word lines DWL1 and DWL2 may have a line shape extending in the third direction D3 that intersects with the first and second directions D1 and D2.

The first and second bit lines BL and CBL may be vertically oriented in the first direction D1. The first and second bit lines BL and CBL may be referred to as vertically oriented bit lines or pillar-type bit lines. The first and second bit lines BL and CBL may include a conductive material. The first and second bit lines BL and CBL may include a silicon-based material, a metal-based material, or a combination thereof. The first and second bit lines BL and CBL may include silicon, a metal, a metal nitride, a metal silicide, or a combination thereof. The first and second bit lines BL and CBL may include polysilicon, titanium nitride, tungsten, or a combination thereof. For example, the first and second bit lines BL and CBL may include polysilicon or titanium nitride (TiN), which is doped with an N-type impurity. The first and second bit lines BL and CBL may include a TiN/W stack including titanium nitride and tungsten over titanium nitride.

The first memory M1 and the second memory M2 may share the second bit line CBL. The first memory cells MC1 and the second memory cells MC2 may share the second bit line CBL.

The first and second word lines DWL1 and DWL2 may extend in the third direction D3, and the first and second channel layers CH1 and CH2 may extend in the second direction D2. The first and second channel layers CH1 and CH2 may be arranged in the second direction D2 and spaced apart laterally from the first and second bit lines BL and CBL. Each of the first and second word lines DWL1 and DWL2 may include a pair of word lines, that is, a first lateral word line WL1 and a second lateral word line WL2. The first lateral word line WL1 and the second lateral word line WL2 may face each other in the first direction D1 with the first and second channel layers CH1 and CH2 interposed therebetween. Gate dielectric layers GD may be formed on the upper and lower surfaces of the first and second channel layers CH1 and CH2.

Each of the first and second transistors TR1 and TR2 may be referred to as a cell transistor. In the first and second word lines DWL1 and DWL2, the same voltage may be applied to the first lateral word line WL1 and the second lateral word line WL2. For example, the first lateral word line WL1 and the second lateral word line WL2 may form a pair associated with the same channel layer, and the same word line driving voltage may be applied to the first lateral word line WL1 and the second lateral word line WL2. As described above, the first transistor TR1 of the first memory cell MC1 according to some embodiments may be a transistor of a double word line structure in which the first lateral word line WL1 and the second lateral word line WL2 are positioned adjacent to the same first channel layer CH1. A transistor having the double word line structure may be referred to as a double gate transistor.

According to other embodiments, different voltages may be applied to the first lateral word line WL1 and the second lateral word line WL2. For example, a word line driving voltage may be applied to the first lateral word line WL1, and a ground voltage may be applied to the second lateral word line WL2. The second lateral word line WL2 may be referred to as a back word line or a shield word line. As a non-limiting example, the ground voltage may be applied to the first lateral word line WL1, and the word line driving voltage may be applied to the second lateral word line WL2.

The first and second channel layers CH1 and CH2 may include a semiconductor material. The first and second channel layers CH1 and CH2 may include a silicon-containing layer or a silicon germanium-containing layer. For example, the first and second channel layers CH1 and CH2 may include monocrystalline silicon, doped polysilicon, undoped polysilicon, amorphous silicon, silicon germanium, or a combination thereof. According to another embodiment, the first and second channel layers CH1 and CH2 may include a nano-wire or a nano sheet, and the nano-wire and the nano sheet may be formed of a semiconductor material. According to further embodiments, the first and second channel layers CH1 and CH2 may include an oxide semiconductor material. According to yet further embodiments, the first and second channel layers CH1 and CH2 may include a first source/drain region, a second source/drain region, and a channel between the first source/drain region and the second source/drain region. The first source/drain region and the second source/drain region may be formed in the first and second channel layers CH1 and CH2 by ion implantation of an impurity or plasma doping. The first and second channel layers CH1 and CH2 may include a two-dimensional material, for example, $MoS_2$ or $MoW_2$.

Each of the first and second lateral word lines WL1 and WL2 of the first and second word lines DWL1 and DWL2 may include notch-type sidewalls that face each other in the second direction D2. The individual notch-type sidewall may include flat surfaces and recessed surfaces. The flat surfaces and the recessed surfaces may be alternately repeated in the third direction D3. The flat surfaces may be flat sidewalls, and the recessed surfaces may be recessed sidewalls. The flat surfaces may face each other in the second direction D2. The recessed surfaces may face each other in the second direction D2.

The first and second channel layers CH1 and CH2 may have a thickness smaller than those of the first and second lateral word lines WL1 and WL2. In other words, the vertical thicknesses of the first and second channel layers CH1 and CH2 in the first direction D1 may be smaller than the vertical thicknesses of the first and second lateral word lines WL1 and WL2 in the first direction D1. As described above, first and second channel layers CH1 and CH2 that have a thickness less than that of first and second lateral word lines WL1 and WL2 may be referred to as thin-body active layers.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The first and second lateral word lines WL1 and WL2 of the first and second word lines DWL1 and DWL2 may include a metal, a metal-base material, a semiconductor material, or a combination thereof. The first and second lateral word lines WL1 and WL2 of the first and second word lines DWL1 and DWL2 may include titanium nitride, tungsten, polysilicon, or a combination thereof. For example, the first and second lateral word lines WL1 and WL2 of the first and second word lines DWL1 and DWL2 may include a TiN/W stack in which titanium nitride and tungsten are sequentially stacked. The first and second lateral word lines WL1 and WL2 of the first and second word lines DWL1 and DWL2 may include an N-type work function material or a P-type work function material. The N-type work function material may have a low work function of approximately 4.5 eV or less, and the P-type work function material may have a high work function of approximately 4.5 eV or more.

The first and second capacitors FC and DC may be laterally positioned in the second direction D2 from the first and second transistors TR1 and TR2. The first and second capacitors FC and DC may include first and second storage nodes SN1 and SN2 that extend laterally from the first and second channel layers CH1 and CH2 in the second direction D2. The first capacitor FC may include a first plate node PN1 over the first storage node SN1, and a ferroelectric layer FE positioned between the first storage node SN1 and the first plate node PN1. The first storage node SN1, the ferroelectric layer FE, and the first plate node PN1 may be laterally arranged in the second direction D2. The second capacitor DC may include a second plate node PN2 over the second storage node SN2, and a paraelectric layer DE between the second storage node SN2 and the second plate node PN2. The second storage node SN2, the paraelectric layer DE, and the second plate node PN2 may be laterally arranged in the second direction D2.

The first storage node SN1 of the first capacitor FC may have a vertical structure extending in the first direction D1. The second storage node SN2 of the second capacitor DC may have a laterally oriented cylinder-like shape. The second storage node SN2 of the second capacitor DC may have a three-dimensional structure, and the second storage node SN2 of the three-dimensional structure may have a lateral three-dimensional structure that is oriented in the second direction D2. As an example of the 3D structure, the second storage node SN2 may have a cylinder shape. According to another embodiment, the second storage node SN2 may have a pillar shape or a pylinder shape. The pylinder shape may refer to a structure in which elements of a pillar shape and elements of a cylinder shape are merged.

The paraelectric layer DE of the second capacitor DC may conformally cover the cylindrical inner wall of the second storage node SN2. The second plate node PN2 of the second capacitor DC may have a shape extending to the cylindrical inner wall of the second storage node SN2 common to the paraelectric layer DE. The second storage node SN2 may be electrically connected to the second channel layer CH2.

The first and second storage nodes SN1 and SN2 and the first and second plate nodes PN1 and PN2 may include a metal, a noble metal, a metal nitride, a conductive metal oxide, a conductive noble metal oxide, a metal carbide, a metal silicide, or a combination thereof. For example, the first and second storage nodes SN1 and SN2 and the first and second plate nodes PN1 and PN2 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The first and second plate nodes PN1 and PN2 may include a combination of a metal-based material and a silicon-based material. For example, the first and second plate nodes PN1 and PN2 may be a stack of titanium nitride/silicon germanium/tungsten nitride (TiN/SiGe/WN).

The paraelectric layer DE of the second capacitor DC may include a non-ferroelectric material. The paraelectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the paraelectric layer DE may include a high-k material having a dielectric constant of approximately 4 or more. The high-k material may have a dielectric constant of approximately 20 or more. The high-k materials may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the paraelectric layer DE may be formed of a composite layer including two or more layers of the above-mentioned high-k materials.

The paraelectric layer DE may be formed of a zirconium (Zr)-based oxide. The paraelectric layer DE may have a stack structure including at least zirconium oxide ($ZrO_2$). The paraelectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the paraelectric layer DE may be formed of hafnium (Hf)-based oxide. The paraelectric layer DE may have a stack structure including at least hafnium oxide ($HfO_2$). The paraelectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the paraelectric layer DE may include a stack of a high-k material and a high-bandgap material having a greater bandgap than the high-k material. The paraelectric layer DE may include silicon oxide ($SiO_2$) as a high bandgap material other than aluminum oxide ($Al_2O_3$). Since the paraelectric layer DE includes a high bandgap material, leakage current may be suppressed. The high-bandgap material may be thinner than the high-k material. According to another embodiment of the present invention, the paraelectric layer DE may include a laminated structure in which a high-k material and a high-bandgap material are alternately stacked. For example, the paraelectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the paraelectric layer DE may include a stack structure, a laminated structure, or a mixed structure including zirconium oxide, hafnium oxide, and aluminum oxide.

The ferroelectric layer FE of the first capacitor FC may include a ferroelectric material. The ferroelectric layer FE may include $HfO_2$, HfZrO, HfSiO, or a combination thereof. The ferroelectric layer FE may include perovskite (e.g., PZT, $BaTiO_3$, etc.), $BiFeO_3$, or a layered perovskite material.

According to another embodiment of the present invention, an interface control layer (not shown) for improving leakage current may be further formed between the second storage node SN2 and the paraelectric layer DE. The interface control layer may include titanium oxide ($TiO_2$), niobium oxide, or niobium nitride. The interface control layer may also be formed between the second plate node PN2 and the paraelectric layer DE.

The first and second capacitors FC and DC may include a metal-insulator-metal (MIM) capacitor. The first and second storage nodes SN1 and SN2 and the first and second plate nodes PN1 and PN2 may include a metal-based material.

The adjacent first and second channel layers CH1 and CH2 may contact a first bit line BL and a second bit line CBL, respectively, in the second direction D2. The first and second channel layers CH1 and CH2 positioned adjacent to each other in the third direction D3 may share one word line DWL1 and DWL2.

In the first and second memories M1 and M2, a plurality of word lines DWL1 and DWL2 may be vertically stacked in the first direction D1. Each of the word lines DWL1 and DWL2 may include a pair of a first lateral word line WL1 and a second lateral word line WL2. Between the first lateral word line WL1 and the second lateral word line WL2, a plurality of the first and second channel layers CH1 and CH2 may be laterally arranged to be spaced apart from each other in the second direction D2. According to another embodiment of the present invention, the structure of the word lines DWL1 and DWL2 may be replaced with a single word line structure that is formed of only the first lateral word line WL1 or the second lateral word line WL2 alone.

The lower structure LS may be a material that is appropriate for semiconductor processing. The lower structure LS may include at least one or more selected from among a conductive material, a dielectric material, and a semiconductor material. The lower structure LS may include a semiconductor substrate, and the semiconductor substrate may be formed of a material containing silicon. The lower structure LS may include silicon, monocrystalline silicon, polysilicon, amorphous silicon, silicon germanium, monocrystalline silicon germanium, polycrystalline silicon germanium, carbon doped silicon, a combination thereof, or a multi-layer thereof. The lower structure LS may include other semiconductor materials, such as germanium (Ge). The lower structure LS may include a III/V-group semiconductor substrate, for example, a compound semiconductor substrate, such as gallium arsenide (GaAs). The lower structure LS may include a Silicon-On-Insulator (SOI) substrate.

According to another embodiment of the present invention, the lower structure LS may include peripheral circuits.

The peripheral circuits may include a plurality of peripheral circuit transistors. The peripheral circuits may be positioned at a lower level than the first and second memories M1 and M2. This may be referred to as a COP (Cell-Over-Peripheral) structure. The peripheral circuits may include at least one or more control circuits for driving the first and second memories M1 and M2. The at least one control circuit of the peripheral circuits may include an N-channel transistor, a P-channel transistor, a CMOS circuit, or a combination thereof. The at least one or more control circuits of the peripheral circuits may include an address decoder circuit, a read circuit, a write circuit, and the like. The at least one control circuit of the peripheral circuits may include a planar channel transistor, a recess channel transistor, a buried gate transistor, a fin channel transistor (FinFET), and the like.

For example, the peripheral circuits may include sub-word line drivers and a sense amplifier. The first and second word lines DWL1 and DWL2 may be coupled to the sub-word line driver. The first and second bit lines BL and CBL may be coupled to the sense amplifier.

According to another embodiment, the lower structure LS may be positioned at a higher level than the first and second memories M1 and M2. This may be referred to as a POC (Peripheral-Over-Cell) structure. In the POC structure, the peripheral circuits may be positioned at a higher level than the first and second memories M1 and M2.

Referring to FIGS. 1 and 2, the semiconductor device 100 may be a hybrid memory device in which a first memory M1 and a second memory M2 are integrated in one die. The first memory M1 may be a 1T-1F (1 transistor-1 ferroelectric capacitor) FERAM, and the second memory M2 may be a 1T-1C (1 transistor-1 capacitor) DRAM. In the semiconductor device 100, the first memory M1 may occupy most of the area. The first capacitor FC of the first memory M1 may have a smaller area than the second capacitor DC of the second memory M2, and accordingly, the first capacitor FC may be able to adopt a planar capacitor.

In embodiments where the first memory M1 includes an FeRAM and the second memory M2 includes a DRAM, the FeRAM may have a large sensing margin, and thus the sizes of the first capacitors FC may be reduced. Also, the DRAM may compensate for the insufficient speed and durability of the FeRAM. Since the other constituent elements, except for the first and second capacitors FC and DC, are formed to have the same structure as those of the first memory M1 and the second memory M2, it is possible to simplify the process of forming the first memory M1 and the second memory M2 on one chip. For example, the first bit line BL and the second bit line CBL may be formed to have the same structure, and the first transistor TR1 and the second transistor TR2 may be formed to have the same structure. Also, the first word line DWL1 and the second word line DWL2 may be formed to have the same structure, and the first channel layer CH1 and the second channel layer CH2 may be formed to have the same structure.

Since the first memory M1 and the second memory M2 are integrated in one die to form an in-chip, energy efficiency required for data migration may be increased.

Figure 3:
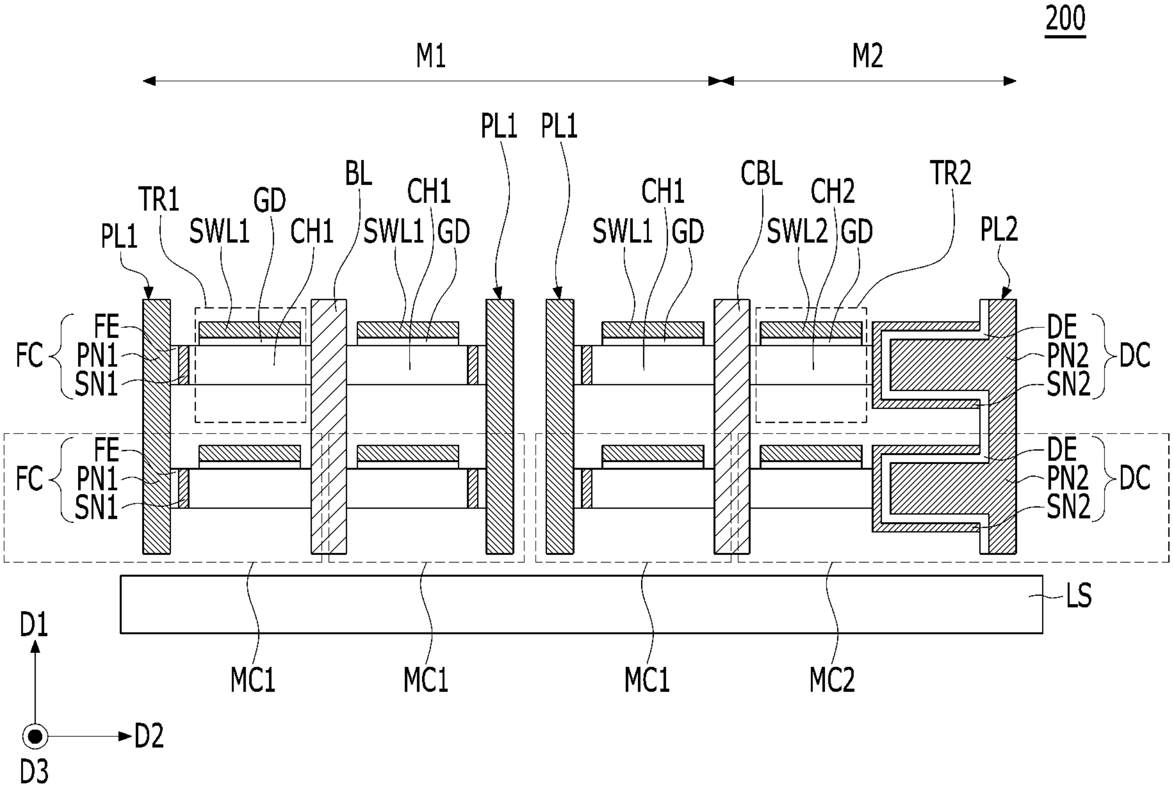
FIGS. 3 to 5 are schematic cross-sectional views illustrating a semiconductor device in accordance with another embodiment of the disclosure.
Figure 4:
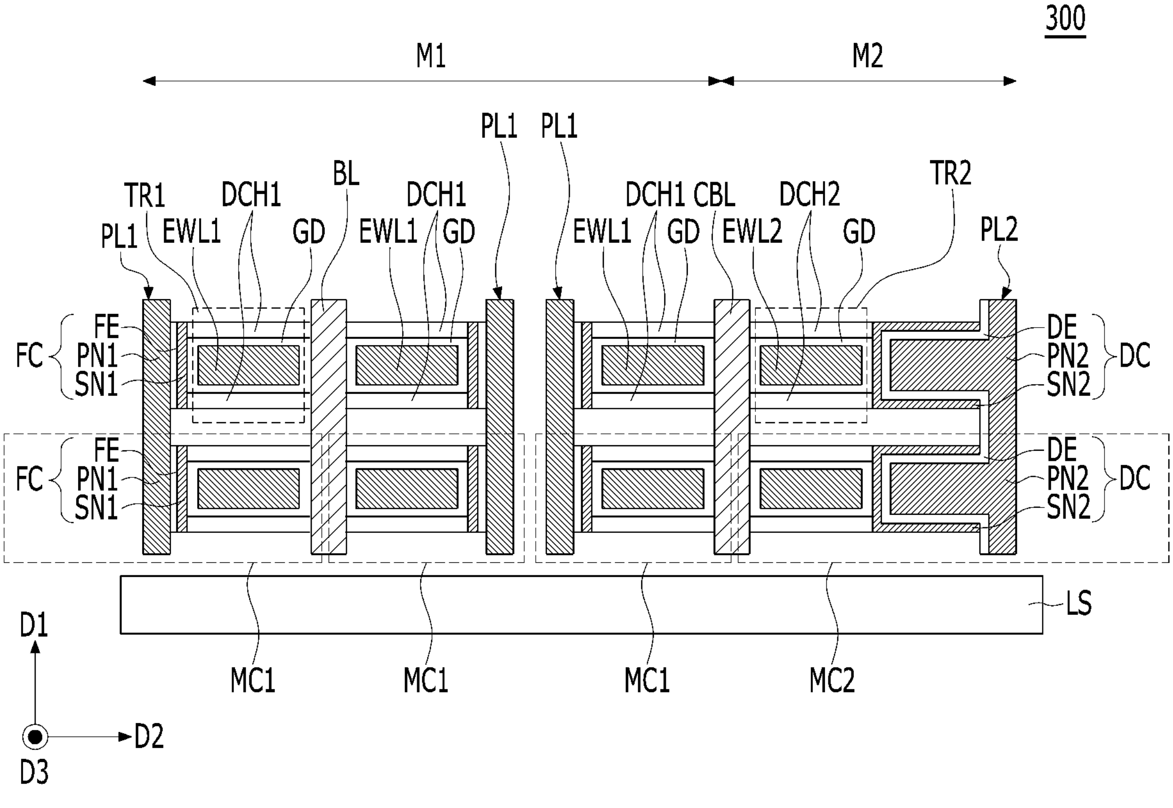
Figure 5:
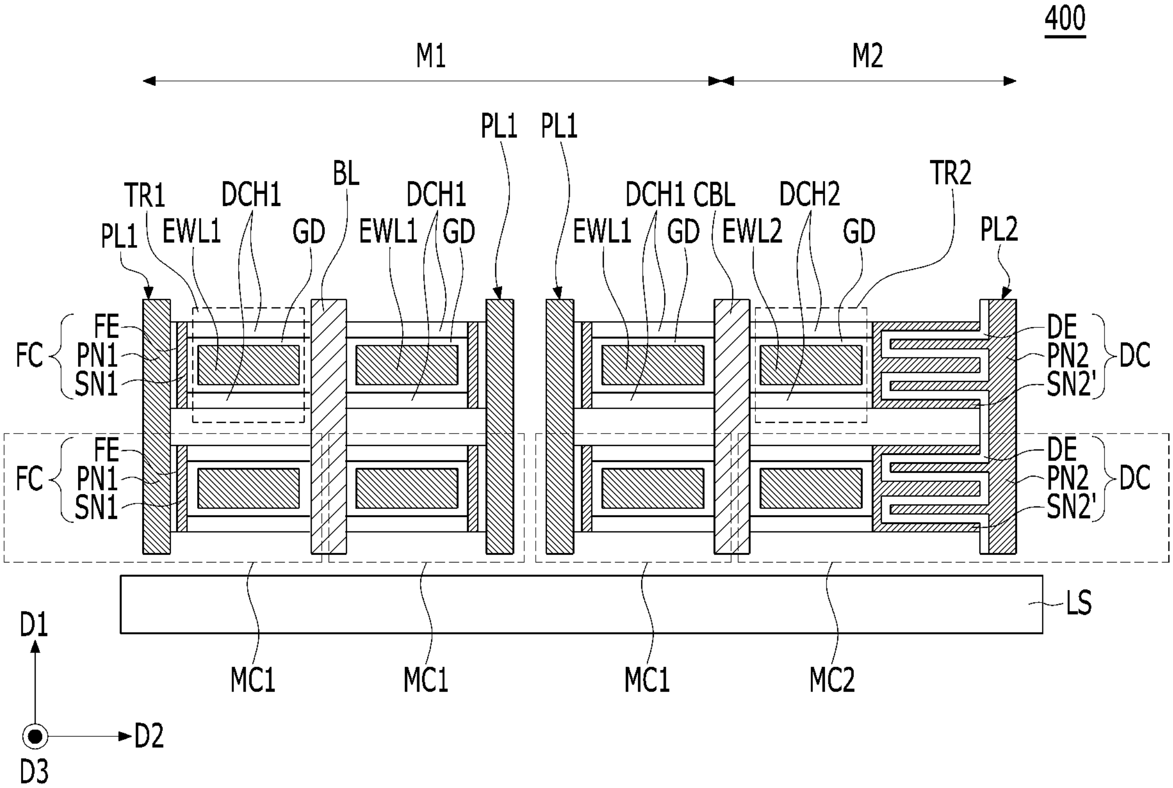

FIGS. 3 to 5 are schematic cross-sectional views illustrating a semiconductor device in accordance with another embodiment of the disclosure. The semiconductor device 200 of FIG. 3, the semiconductor device 300 of FIG. 4, and the semiconductor device 400 of FIG. 5 may be similar to the semiconductor device 100 of FIG. 1. Hereinafter, detailed descriptions of the constituent elements also appearing in FIG. 1 will be omitted.

Referring to FIG. 3, a semiconductor device 200 may include a first memory M1 and a second memory M2 over the lower structure LS. The first memory M1 may be a ferroelectric memory FERAM, and the second memory M2 may be a DRAM. Each of the first memory M1 and the second memory M2 may have a three-dimensional structure. The first memory M1 and the second memory M2 may be positioned laterally in the second direction D2.

The first memory M1 may include a first bit line BL, a first transistor TR1, and a first capacitor FC. The second memory M2 may include a second bit line CBL, a second transistor TR2, and a second capacitor DC. The first capacitor FC may include a first storage node SN1, a ferroelectric layer FE, and a first plate node PN1. The second capacitor DC may include a second storage node SN2, a paraelectric layer DE, and a second plate node PN2. The first memory M1 and the second memory M2 may share the second bit line CBL. The first memory cells MC1 and the second memory cells MC2 may share the second bit line CBL.

The first transistors TR1 of the first memory M1 may include a first single word line SWL1, and the second transistors TR2 of the second memory M2 may include a second single word line SWL2. The first single word line SWL1 may be positioned over the first channel layer CH1, and the second single word line SWL2 may be positioned over the second channel layer CH2.

Referring to FIG. 4, a semiconductor device 300 may include a first memory M1 and a second memory M2 over the lower structure LS. The first memory M1 may be a ferroelectric memory FERAM, and the second memory M2 may be a DRAM. Each of the first memory M1 and the second memory M2 may have a three-dimensional structure. The first memory M1 and the second memory M2 may be positioned laterally in the second direction D2.

The first memory M1 may include a first bit line BL, a first transistor TR1, and a first capacitor FC. The second memory M2 may include a second bit line CBL, a second transistor TR2, and a second capacitor DC. The first capacitor FC may include a first storage node SN1, a ferroelectric layer FE, and a first plate node PN1. The second capacitor DC may include a second storage node SN2, a paraelectric layer DE, and a second plate node PN2. Some of the first memory cells MC1 of the first memory M1 and the second memory cells MC2 of the second memory M2 may share the second bit line CBL.

The first transistors TR1 of the first memory M1 may include a first double channel layer DCH1 and a first embedded word line EWL1, and the second transistors TR2 of the second memory M2 may include a second double channel layer DCH2 and a second embedded word line EWL2. The first embedded word line EWL1 may be positioned between the first double channel layer DCH1. The portion of the first double channel layer DCH1 above or below the first embedded word line EWL1 may be thinner than the first embedded word line EWL1. The gate dielectric layer GD may surround the first embedded word line EWL1. The second embedded word line EWL2 may be positioned between the second double channel layer DCH2. The portion of the second double channel layer DCH2 above or below the second embedded word line EWL2 may be thinner than the second embedded word line EWL2. The gate dielectric layer GD may surround the second embedded word line EWL2. The first double channel layers DCH1 may be positioned between the first capacitors FC and the first bit line BL. The first double channel layers DCH1 may be electrically connected to the first capacitors FC and the first bit line BL. The second double channel layers DCH2 may be positioned between the second capacitors DC and the second bit line CBL. The second double channel layers DCH2 may be electrically connected to the second capacitors DC and the second bit line CBL. Some of the first double channel layers DCH1 of the first memory M1 may be positioned between the first capacitors FC and the second bit line CBL. Some of the first double channel layers DCH1 of the first memory M1 may be electrically connected to the first capacitors FC and the second bit line CBL.

Referring to FIG. 5, a semiconductor device 400 may include a first memory M1 and a second memory M2 over the lower structure LS. The first memory M1 may be a ferroelectric memory FERAM, and the second memory M2 may be a DRAM. Each of the first memory M1 and the second memory M2 may have a three-dimensional structure. The first memory M1 and the second memory M2 may be positioned laterally in the second direction D2.

The first memory M1 may include a first bit line BL, a first transistor TR1, and a first capacitor FC. The second memory M2 may include a second bit line CBL, a second transistor TR2, and a second capacitor DC. The first capacitor FC may include a first storage node SN1, a ferroelectric layer FE, and a first plate node PN1. The second capacitor DC may include a second storage node SN2', a paraelectric layer DE, and a second plate node PN2. The second storage node SN2' may have a double cylinder shape.

Some of the first memory cells MC1 of the first memory M1 and the second memory cells MC2 of the second memory M2 may share the second bit line CBL.

The first transistors TR1 of the first memory M1 may include a first double channel layer DCH1 and a first embedded word line EWL1, and the second transistors TR2 of the second memory M2 may include a second double channel layer DCH2 and a second embedded word line EWL2. The first embedded word line EWL1 may be positioned between the first double channel layer DCH1. Portions of the first double channel layer DCH1 may be thinner than the first embedded word line EWL1. The gate dielectric layer GD may surround the first embedded word line EWL1. The second embedded word line EWL2 may be positioned between the second double channel layer DCH2. Portions of the second double channel layer DCH2 may be thinner than the second embedded word line EWL2. The gate dielectric layer GD may surround the second embedded word line EWL2. The first double channel layers DCH1 may be positioned between the first capacitors FC and the first bit line BL. The first double channel layers DCH1 may be electrically connected to the first capacitors FC and the first bit line BL. The second double channel layers DCH2 may be positioned between the second capacitors DC and the second bit line CBL. The second double channel layers DCH2 may be electrically connected to the second capacitors DC and the second bit line CBL. Some of the first double channel layers DCH1 of the first memory M1 may be positioned between the first capacitors FC and the second bit line CBL. Some of the first double channel layers DCH1 of the first memory M1 may be electrically connected to the first capacitors FC and the second bit line CBL.

Referring to FIGS. 3 to 5, the semiconductor devices 200, 300, and 400 may be hybrid memory devices in which the first memory M1 and the second memory M2 are integrated in one die. The first memory M1 may be a 1T-1F FERAM, and the second memory M2 may be a 1T-1C DRAM. In the semiconductor devices 200, 300, and 400, the first memory M1 may occupy most of the area. The volume occupied by the individual first capacitors FC may be smaller than the volume occupied by the individual second capacitors DC. When it is assumed that the first memory M1 and the second memory M2 have the same size, more first capacitors FC may be formed than second capacitors DC. The first capacitor FC of the first memory M1 may realize a planar capacitor so as to increase the cell density and obtain the ferroelectric (Persistent) characteristic.

The insufficient durability characteristics of the first memory M1 may be supplemented by the second memory M2.

Since the first and second double channel layers DCH1 and DCH2 are formed as shown in FIGS. 4 and 5, the first capacitor FC may be quickly charged. Thus, speed drops can be avoided even at a low write driving voltage.

With the double channel layer structure, the write speed of the first capacitor FC may be improved and the driving voltages of the first embedded word lines EWL1 may be reduced.

FIGS. 6 to 16 illustrate a method for fabricating a semiconductor device in accordance with another embodiment of the present invention.

Figure 6:
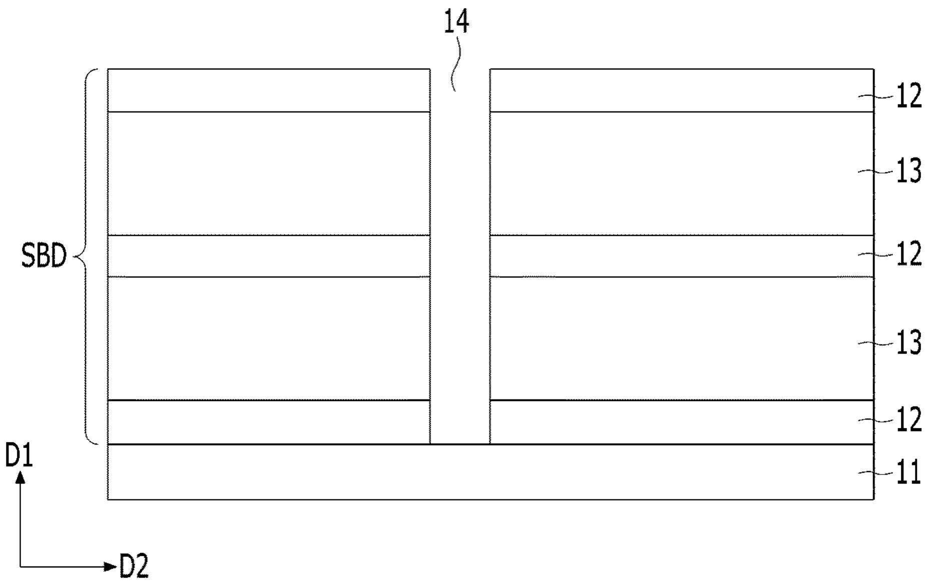
FIGS. 6 to 16 illustrate a method for fabricating a semiconductor device in accordance with another embodiment of the present disclosure.

Referring to FIG. 6, a stack body SBD may be formed over the lower structure 11. The stack body SBD may include cell isolation dielectric layers 12 and sacrificial dielectric layers 13. The stack body SBD may be formed by alternately stacking the cell isolation dielectric layers 12 and the sacrificial dielectric layers 13. The cell isolation dielectric layers 12 and the sacrificial dielectric layers 13 may be formed of different materials. The cell isolation dielectric layers 12 may include silicon oxide, and the sacrificial dielectric layers 13 may include silicon nitride.

Subsequently, a first opening 14 may be formed by etching a first portion of the stack body SBD. The first opening 14 may extend in a direction perpendicular to the surface of the lower structure 11.

Figure 7:
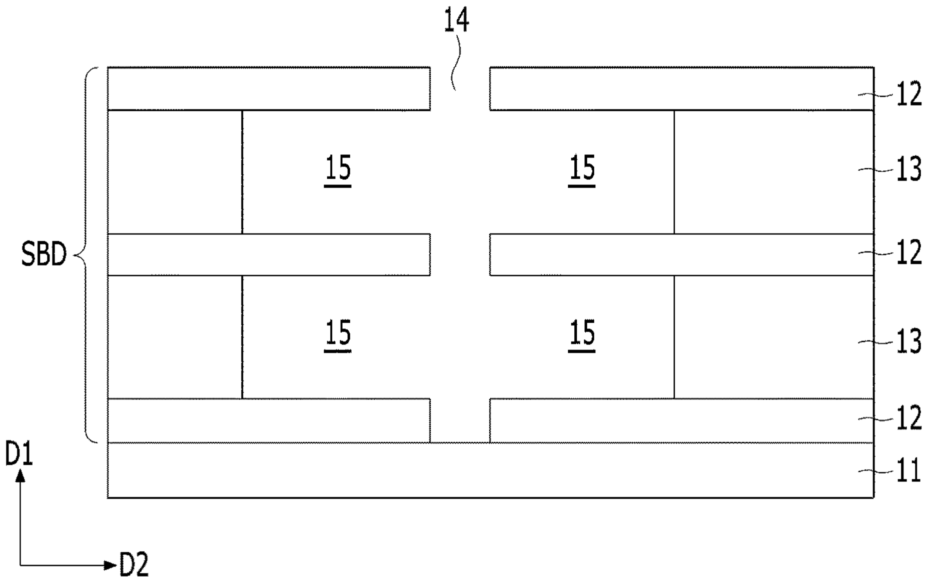

Referring to FIG. 7, portions of the sacrificial dielectric layers 13 may be selectively recessed through the first opening 14. As a result, transistor openings 15 may be formed between the cell isolation dielectric layers 12.

Figure 8:
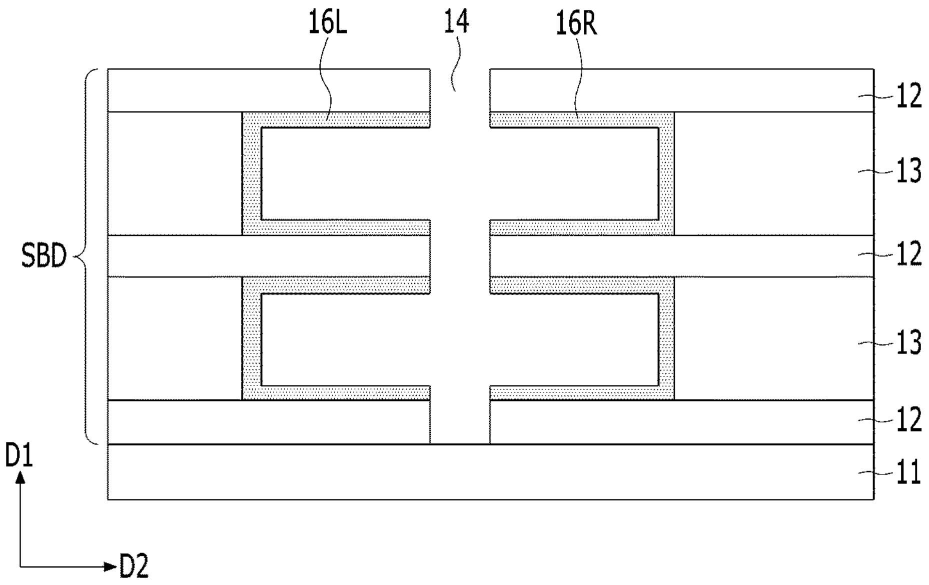

Referring to FIG. 8, first and second preliminary channel layers 16L and 16R may be formed in the transistor openings 15, respectively. The first and second preliminary channel layers 16L and 16R may include a semiconductor material. The first and second preliminary channel layers 16L and 16R may include monocrystalline silicon, polysilicon, an oxide semiconductor, or a combination thereof. For example, the first and second preliminary channel layers 16L and 16R may be formed by depositing a polysilicon layer and then performing an etch-back process. The first and second preliminary channel layers 16L and 16R may have a laterally oriented cylindrical shape. Adjacent first and second preliminary channel layers 16L and 16R may be vertically isolated from each other by the cell isolation dielectric layers 12.

Figure 9:
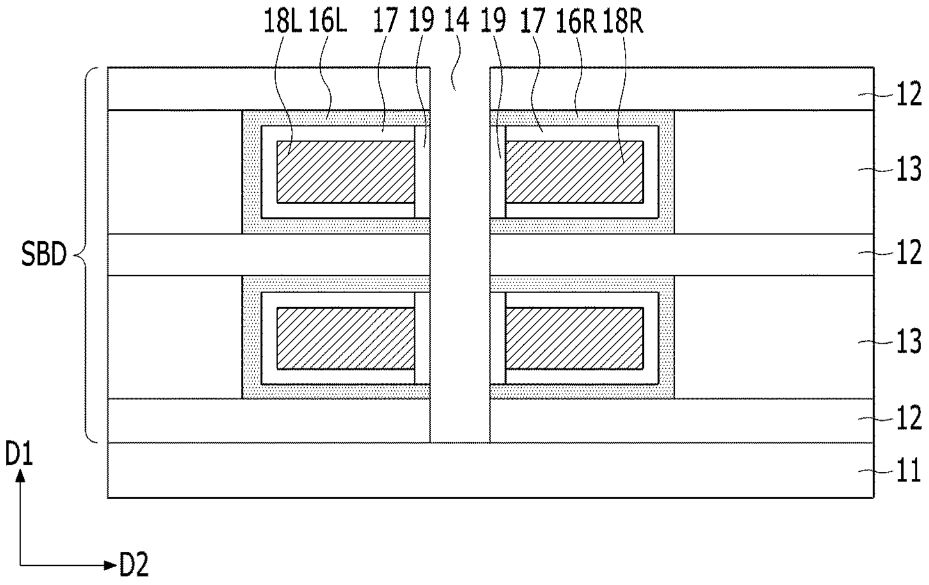

Referring to FIG. 9, a gate dielectric layer 17, first and second word lines 18L and 18R, and a first word line capping layer 19 may be formed sequentially in the internal space of the first and second preliminary channel layers 16L and 16R. The first and second word lines 18L and 18R may fill the internal space of the first and second preliminary channel layers 16L and 16R over the gate dielectric layer 17. The first word line capping layer 19 may cover one side of the first and second word lines 18L and 18R. The first and second word lines 18L and 18R may be embedded in the internal space of the first and second preliminary channel layers 16L and 16R. The first word line 18L may be embedded in the internal space of the first preliminary channel layer 16L. The second word line 18R may be embedded in the internal space of the second preliminary channel layer 16R. The first and second word lines 18L and 18R may correspond to the first and second embedded word lines EWL1 and EWL2 which are described above with reference to FIGS. 4 and 5.

The gate dielectric layer 17 is a silicon oxide, silicon nitride, metal oxide, metal oxynitride, metal silicate, high-k material, ferroelectric material, an anti-ferroelectric material, or a combination thereof. The gate dielectric layer 17 may include $SiO_2$, $Si_3N_4$, $HfO_2$, $Al_2O_3$, $ZrO_2$, AlON, HfON, HfSiO, HfSiON, or HfZrO.

The first and second word lines 18L and 18R may include a metal, a metal alloy, or a semiconductor material. The first and second word lines 18L and 18R may include titanium nitride, tungsten, polysilicon, or a combination thereof. According to another embodiment of the present invention, the first and second word lines 18L and 18R may include a TiN/W stack in which titanium nitride and tungsten are sequentially stacked. According to another embodiment of the present invention, the first and second word lines 18L and 18R may include an N-type work function material or a P-type work function material. The N-type work function material may have a low work function of approximately 4.5 eV or less, and the P-type work function material may have a high work function of approximately 4.5 eV or more.

The first word line capping layer 19 may include a dielectric material. The first word line capping layer 19 may include silicon oxide, silicon nitride, or a combination thereof.

Figure 10:
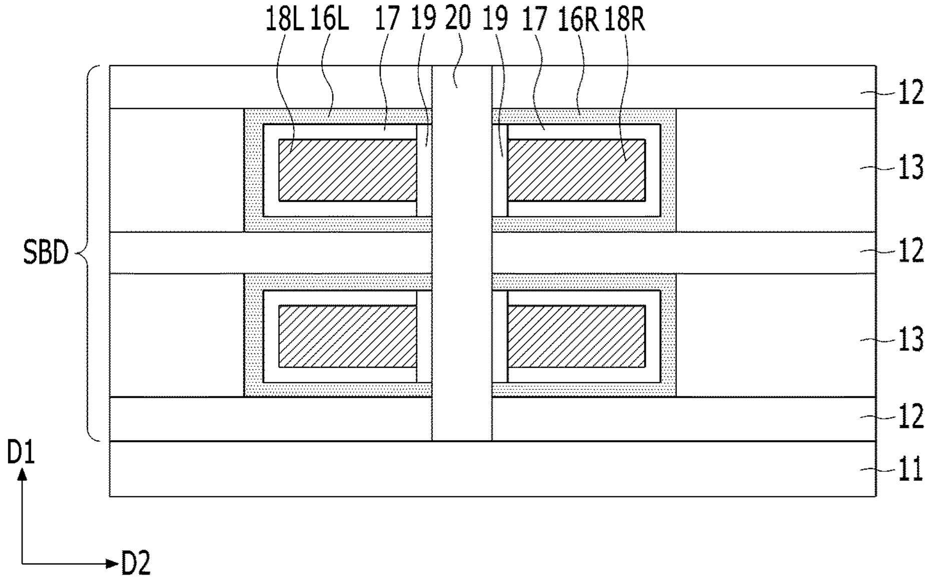

Referring to FIG. 10, a bit line 20 filling the first opening 14 may be formed. The bit line 20 may extend in a direction perpendicular to the surface of the lower structure 11. The bit line 20 may directly contact the preliminary channel layers 16L and 16R. The bit line 20 may include a metal, a metal alloy, or a semiconductor material. The bit line 20 may include titanium nitride, tungsten, polysilicon, or a combination thereof. According to another embodiment of the present invention, the bit line 20 may include a TiN/W stack in which titanium nitride and tungsten are sequentially stacked. A first word line capping layer 19 may be positioned between the bit line 20 and the first and second word lines 18L and 18R.

Figure 11:
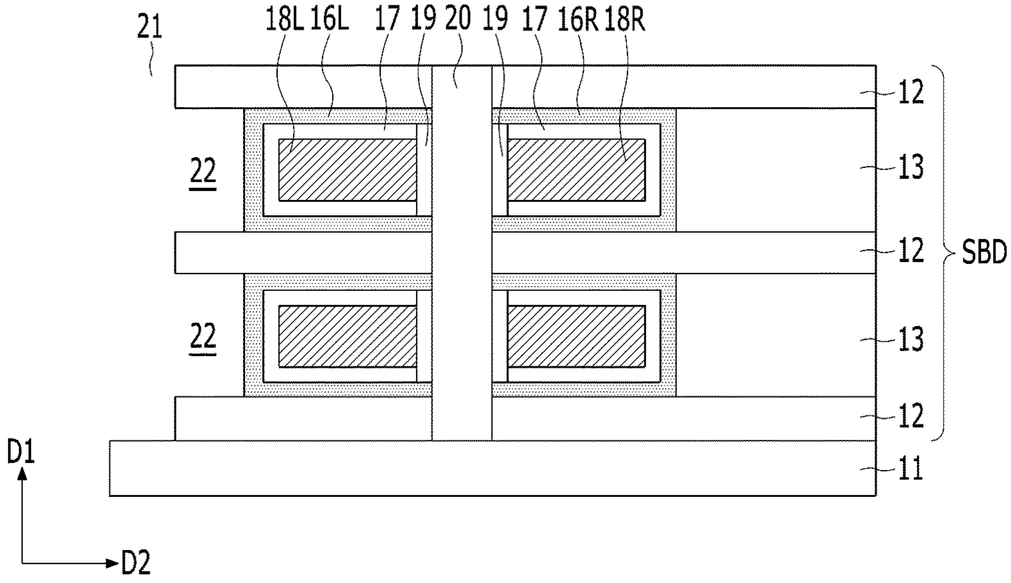

Referring to FIG. 11, a second opening 21 may be formed by etching a second portion of the stack body SBD. The second opening 21 may extend in a direction perpendicular to the surface of the lower structure 11.

Subsequently, a portion of the sacrificial dielectric layers 13 may be selectively recessed through the second opening 21 until the sidewalls of the first preliminary channel layer 16L are exposed. As a result, first capacitor openings 22 may be formed.

Figure 12:
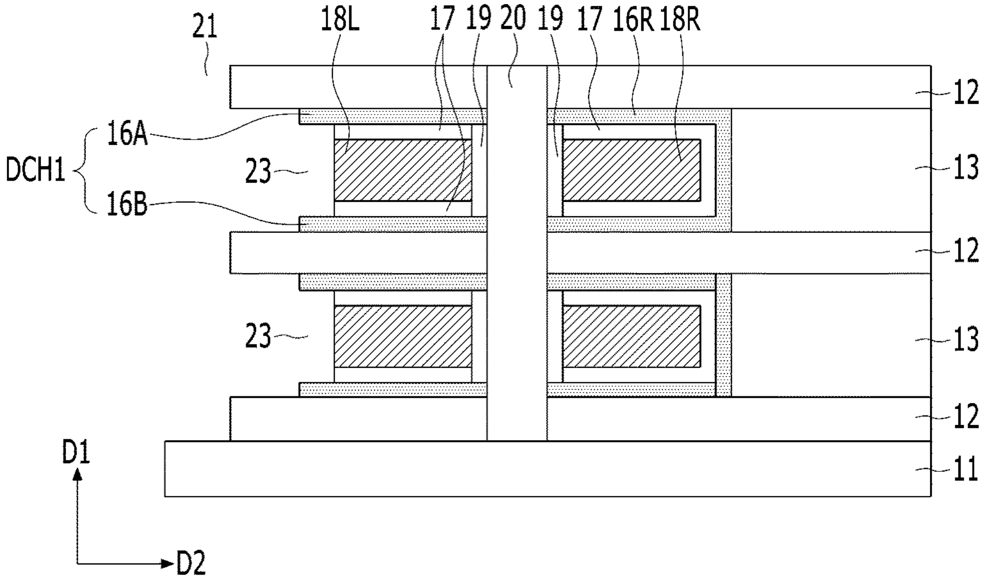

Referring to FIG. 12, in order to divide the first preliminary channel layer 16L into the first double channel layer DCH1, the first capacitor openings 22 may be expanded. The process of expanding the first capacitor openings 22 may include etching portions of the first preliminary channel layer 16L and gate dielectric layer 17, until the expanded first capacitor openings 23 may expose the sidewall of the first word line 18L. The first double channel layer DCH1 may include a first upper level channel layer 16A and a first lower level channel layer 16B. The first upper level channel layer 16A and the first lower level channel layer 16B may be formed by cutting a portion of the first preliminary channel layer 16L.

The first upper level channel layer 16A and the first lower level channel layer 16B may vertically face each other with the first word line 18L interposed therebetween. The gate dielectric layer 17 may be positioned between the first word line 18L and the first double channel layer DCH1.

Figure 13:
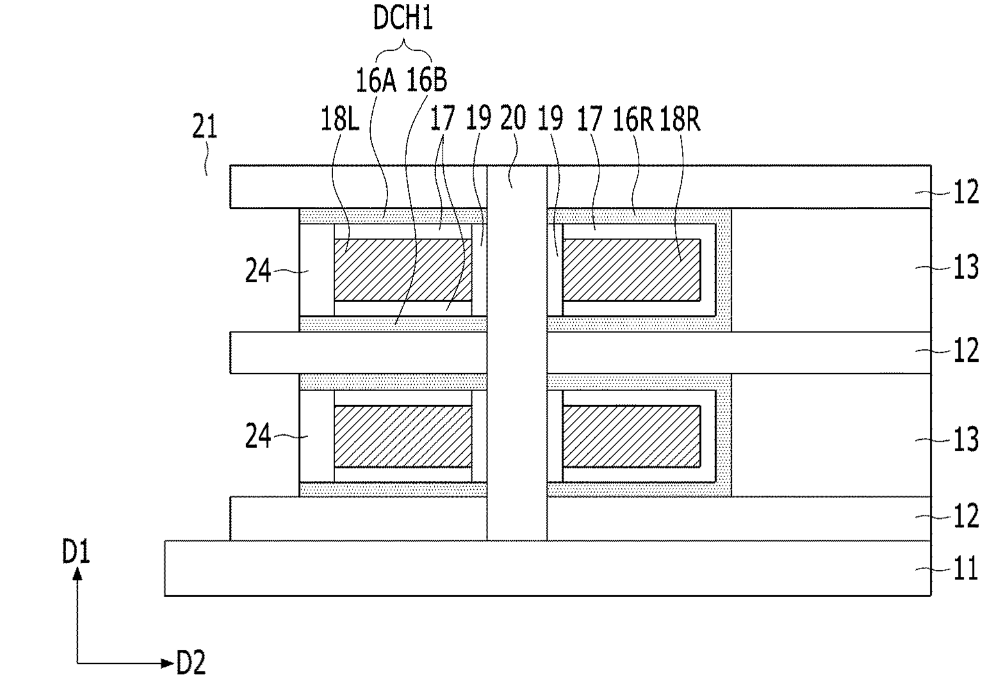

Referring to FIG. 13, a second word line capping layer 24 may be formed between the first upper-level channel layer 16A and the first lower-level channel layer 16B. The second word line capping layer 24 may include a dielectric material. The second word line capping layer 24 may include silicon oxide, silicon nitride, or a combination thereof.

Figure 14:
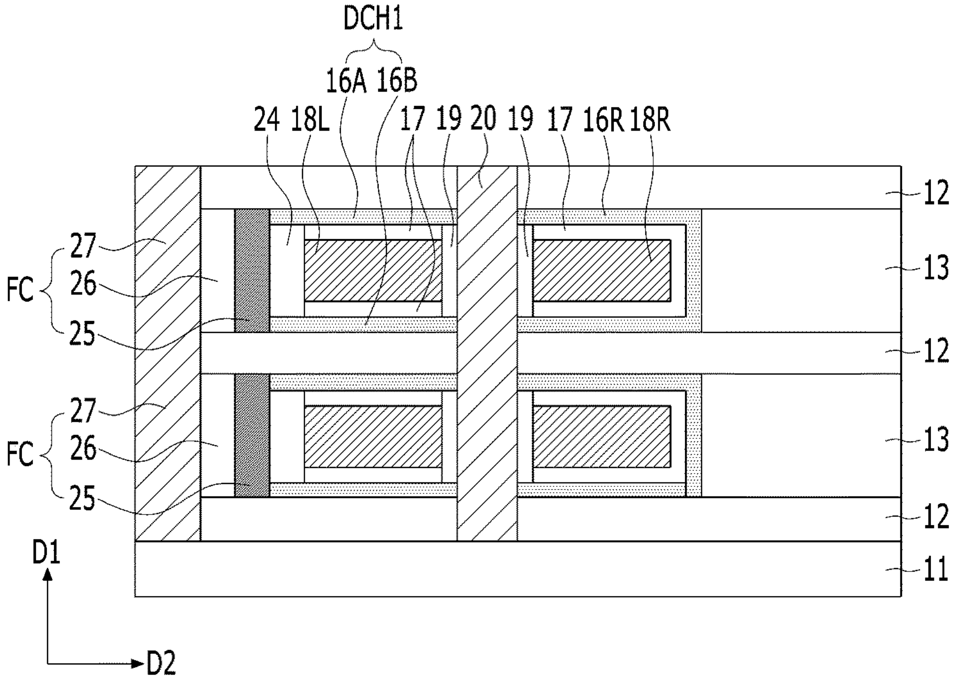

Referring to FIG. 14, a first capacitor FC coupled to the first double channel layer DCH1 may be formed. The first capacitor FC may include a first storage node 25, a ferroelectric layer 26, and a first plate node 27. The first storage node 25 may have a flat plate shape. The ferroelectric layer 26 may include a ferroelectric material. The first storage node 25 may be simultaneously coupled to the first upper-level channel layer 16A and the first lower-level channel layer 16B.

The first storage node 25 and the first plate node 27 may include a metal, a noble metal, a metal nitride, a conductive metal oxide, a conductive noble metal oxide, a metal carbide, a metal silicide, or a combination thereof. For example, the first storage node 25 and the first plate node 27 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, and a tungsten nitride/tungsten (WN/W) stack.

The ferroelectric layer 26 may include $HfO_2$, HfZrO, HfSiO, or a combination thereof. The ferroelectric layer 26 may include perovskite (e.g., PZT, $BaTiO_3$, etc.), $BiFeO_3$, or a layered perovskite material.

The vertically arranged first storage nodes 25 may be isolated from each other by the cell isolation dielectric layers 12. The first plate nodes 27 may be coupled to each other.

Figure 15:
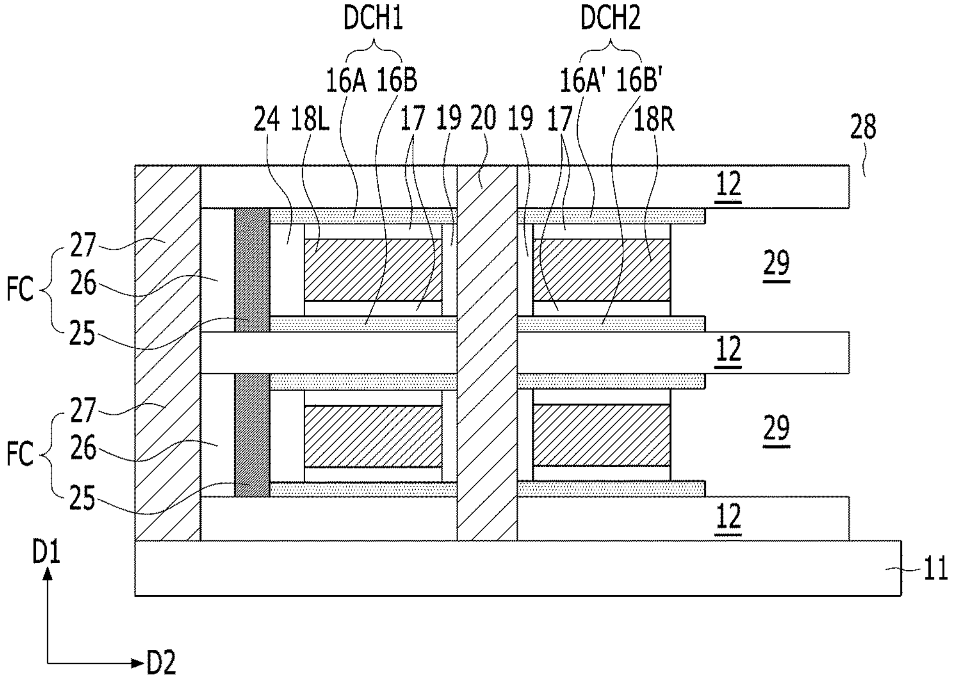

Referring to FIG. 15, a third opening 28 may be formed by etching a third portion of the stack body SBD. The third opening 28 may extend in a direction perpendicular to the surface of the lower structure 11.

Subsequently, a portion of the sacrificial dielectric layers 13 may be selectively recessed through the third opening 28 until the sidewalls of the second preliminary channel layer 16R are exposed. As a result, second capacitor openings 29 may be formed.

Subsequently, in order to divide the second preliminary channel layer 16R into the second double channel layer DCH2, the second capacitor openings 29 may be expanded. The process of expanding the second capacitor openings 29 may include etching portions of the second preliminary channel layer 16R and gate dielectric layer 17, until the expanded second capacitor openings 29 expose the sidewall of the second word line 18R. The second double channel layer DCH2 may include a second upper level channel layer 16A' and a second lower level channel layer 16B'. The second upper level channel layer 16A' and the second lower level channel layer 16B' may be formed by cutting a portion of the second preliminary channel layer 16R.

The second upper-level channel layer 16A' and the second lower-level channel layer 16B' may vertically face each other with the second word line 18R interposed therebetween. A gate dielectric layer 17 may be positioned between the second word line 18R and the second double channel layer DCH2.

The first double channel layer DCH1 and the second double channel layer DCH2 may be positioned at the same vertical level and be arranged laterally in the second direction D2. The first upper-level channel layer 16A and the second upper-level channel layer 16A' may be positioned at the same vertical level in the first direction D1, and the first lower-level channel layer 16B and the second lower-level channel layer 16B' may be positioned at the same vertical level.

Figure 16:
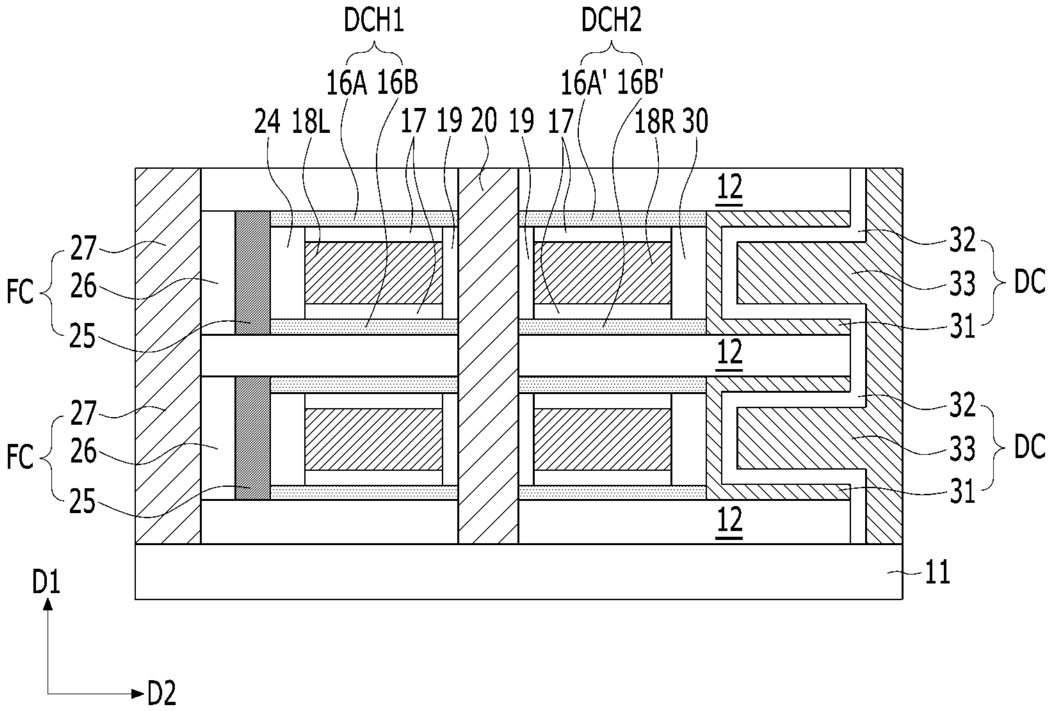

Referring to FIG. 16, a third word line capping layer 30 may be formed between the second upper-level channel layer 16A' and the second lower-level channel layer 16B'. The third word line capping layer 30 may include a dielectric material.

Subsequently, a second capacitor DC coupled to the second double channel layer DCH2 may be formed. The second capacitor DC may include a second storage node 31, a paraelectric layer 32, and a second plate node 33. The second storage node 31 may have a cylindrical shape. The second storage node 31 may be simultaneously coupled to the second upper-level channel layer 16A' and the second lower-level channel layer 16B'. The paraelectric layer 32 may include a high-k material. The paraelectric layer 32 may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), strontium titanium oxide ($SrTiO_3$), or a combination thereof. The paraelectric layer 32 may include ZA ($ZrO_2/Al_2O_3$) stack, ZAZ ($ZrO_2/Al_2O_3/ZrO_2$) stack, HA ($HfO_2/Al_2O_3$) stack, HAH ($HfO_2/Al_2O_3/HfO_2$) stack, ZAZA ($ZrO_2/Al_2O_3/ZrO_2/Al_2O_3$) stack, ZAZAZ ($ZrO_2/Al_2O_3/ZrO_2/Al_2O_3/ZrO_2$) stack, HAHA ($HfO_2/Al_2O_3/HfO_2/Al_2O_3$) stack, or a HAHAH ($HfO_2/Al_2O_3/HfO_2/Al_2O_3/HfO_2$) stack.

The second storage node 31 and the second plate node 33 may include a metal, a noble metal, a metal nitride, a conductive metal oxide, a conductive noble metal oxide, a metal carbide, a metal silicide, or a combination thereof. For example, the second storage node 31 and the second plate node 33 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack.

Figure 17:
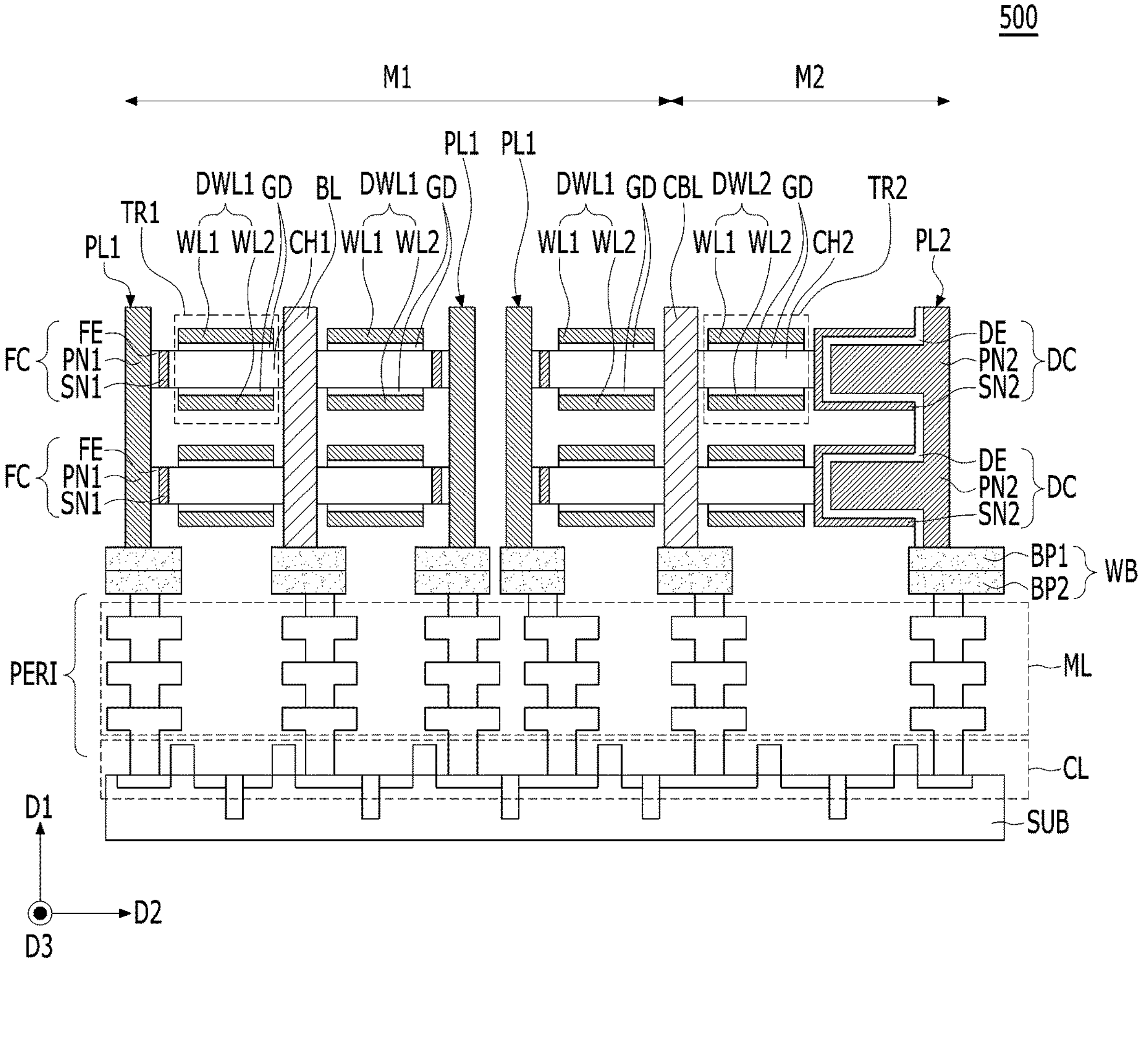
FIG. 17 is a schematic cross-sectional view illustrating a semiconductor device in accordance with another embodiment of the present disclosure.

FIG. 17 is a schematic cross-sectional view illustrating a semiconductor device in accordance with another embodiment of the present disclosure.

Referring to FIG. 17, a semiconductor device 500 may include a peripheral circuit portion PERI, a first memory M1, and a second memory M2. The first and second memories M1 and M2 may be positioned over the peripheral circuit portion PERI. The first and second memories M1 and M2 and the peripheral circuit portion PERI may be coupled by wafer bonding. The semiconductor device 500 may have a COP (Cell-Over-Peripheral) structure. The first memory M1 and the second memory M2 of FIG. 17 may include the first and second memories M1 and M2 as described above with reference to FIGS. 1 to 5. According to an embodiment of the present disclosure, the first memory M1 and the second memory M2 of FIG. 17 may correspond to the first memory M1 and the second memory M2, which are described above by referring to FIG. 1.

The first memory M1 may be a ferroelectric memory FERAM, and the second memory M2 may be a DRAM. Each of the first memory M1 and the second memory M2 may have a three-dimensional structure. FIGS. 1 to 16 may be referred to for the description of the first memory M1 and the second memory M2.

A bonding structure WB may be positioned between the peripheral circuit portion PERI and the first and second memories M1 and M2. The bonding structure WB may include first bonding pads BP1 and second bonding pads BP2. The first and second memories M1 and M2 and the peripheral circuit portion PERI may be coupled to each other through metal-to-metal bonding or hybrid bonding. For example, they may be coupled to each other through the first bonding pads BP1 and the second bonding pads BP2. The metal-to-metal bonding may refer to direct bonding between the first bonding pads BP1 and the second bonding pads BP2, and hybrid bonding may refer to a combination of metal-to-metal bonding and insulating bonding. The first and second bonding pads BP1 and BP2 may include a metal material.

Referring back to FIGS. 1 and 17, the first and second bit lines BL and CBL and the first and second plate lines PL1 and PL2 of the first and second memories M1 and M2 may be respectively coupled to the first bonding pads BP1. The edge portions of the word lines DWL1 and DWL2 may be respectively coupled to the first bonding pad BP1 through contact plugs (not illustrated).

The peripheral circuit portion PERI may include a plurality of control circuits CL and a plurality of interconnections ML that are formed over a substrate SUB. The second bonding pads BP2 may be coupled to the interconnections ML. The control circuits CL may include transistors. The control circuits CL of the peripheral circuit portion PERI may include a sense amplifier, a sub-word line driver, and a plate line control circuit. The sense amplifier may be coupled to the first and second bit lines BL and CBL through the interconnection ML. The sub-word line driver may be coupled to the word lines DWL1 and DWL2 through the interconnection ML. The plate line control circuit may be coupled to the first and second plate lines PL through the interconnection ML.

The control circuits CL of the peripheral circuit portion PERI may be electrically connected to the first and second bit lines BL and CBL, the capacitors FC and DC and the word lines DWL1 and DWL2 of the first and second memories M1 and M2 through the bonding structure WB.

According to another embodiment of the present disclosure, the semiconductor device 500 may have a POC (Peripheral-Over-Cell) structure. The POC structure may refer to a structure in which the peripheral circuit portion PERI is positioned over the first and second memories M1 and M2.

According to embodiments of the present disclosure, a FERAM and a DRAM may be formed within a single chip (in-chip) so that the DRAM may compensate for the insufficient speed and durability of the FeRAM.

According to embodiments of the present disclosure, the process may be simplified by forming a FeRAM including a ferroelectric capacitor and a DRAM including a paraelectric capacitor in a similar structure.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:

a first memory including first capacitors that are vertically stacked in a first direction; and a second memory that is laterally spaced apart from the first memory in a second direction and that includes second capacitors that are vertically stacked in the first direction, wherein each of the first and second memory further includes:

a bit line extending in the first direction;

a channel layer extending from the bit line in the second direction; and a word line extending in a third direction crossing the channel layer, wherein the word line includes:

a first word line and a second word line disposed on an upper surface and a lower surface of the channel layer, respectively.

2. The semiconductor device of claim 1, wherein the first capacitors include ferroelectric capacitors.

3. The semiconductor device of claim 1, wherein the second capacitors include paraelectric capacitors.

4. The semiconductor device of claim 1, wherein each of the first capacitors includes:

a first storage node having a vertical flat plate shape;

a ferroelectric layer over the first storage node; and a first plate node over the ferroelectric layer.

5. The semiconductor device of claim 4, wherein the first plate nodes of the first capacitors extend vertically to couple to each other.

6. The semiconductor device of claim 1, wherein each of the second capacitors includes:

a second storage node having a cylindrical shape;

a paraelectric layer over the second storage node; and a second plate node over the paraelectric layer.

7. A semiconductor device, comprising:

a first memory including first capacitors that are vertically stacked in a first direction; and a second memory that is laterally spaced apart from the first memory in a second direction and that includes second capacitors that are vertically stacked in the first direction, wherein each of the first memory and the second memory further includes:

a bit line extending in the first direction;

a channel layer extending from the bit line in the second direction; and a word line extending in a third direction crossing the channel layer, wherein the channel layer includes a double channel layer, and the word line is embedded in the double channel layer.

8. The semiconductor device of claim 1, further comprising:

peripheral circuits positioned in the first direction at a lower or higher level than the first and second memories.

9. A semiconductor device, comprising:

a first memory including ferroelectric capacitors that are vertically stacked in a first direction; and a second memory laterally spaced apart from the first memory and including paraelectric capacitors that are vertically stacked in the first direction, wherein each of the ferroelectric capacitors includes a first storage node having a vertical flat plate shape, and each of the paraelectric capacitors includes a second storage node having a cylindrical shape, wherein each of the first memory and the second memory further includes:

a bit line extending in the first direction;

a channel layer extending from the bit line in a second direction; and a word line extending in a third direction crossing the channel layer, wherein the word line includes a first word line and a second word line disposed on an upper surface and a lower surface of the channel layer, respectively.

10. The semiconductor device of claim 9, wherein the first memory includes a plurality of first memory cells, and each of the first memory cells has a 1T-1F (1 transistor-1 ferroelectric capacitor) structure including a first transistor and a first ferroelectric capacitor that is electrically connected to the first transistor.

11. The semiconductor device of claim 10, wherein the second memory includes a plurality of second memory cells, and each of the second memory cells has a 1T-1C (1 transistor-1 capacitor) structure including a second transistor and a second paraelectric capacitor that is electrically connected to the second transistor.

12. The semiconductor device of claim 9, wherein each of the ferroelectric capacitors includes:

a ferroelectric layer over the first storage node; and a first plate node over the ferroelectric layer, and first plate nodes of the ferroelectric capacitors are coupled to each other and extend vertically.

13. The semiconductor device of claim 9, wherein each of the paraelectric capacitors includes:

a paraelectric layer over the second storage node; and a second plate node over the paraelectric layer.

14. A semiconductor device, comprising:

a first memory including ferroelectric capacitors that are vertically stacked in a first direction; and a second memory laterally spaced apart from the first memory and including paraelectric capacitors that are vertically stacked in the first direction, wherein each of the ferroelectric capacitors includes a first storage node having a vertical flat plate shape, and each of the paraelectric capacitors includes a second storage node having a cylindrical shape, wherein each of the first memory and the second memory further includes:

a bit line extending in the first direction;

a channel layer extending from the bit line in a second direction; and a word line extending in a third direction crossing the channel layer, wherein the channel layer includes a double channel layer, and the word line is embedded in the double channel layer.

15. The semiconductor device of claim 9, further comprising:

peripheral circuits vertically positioned at a lower or higher level than the first and second memories.

* * * * *